(12) United States Patent
Shoji et al.

(10) Patent No.: US 11,094,974 B2
(45) Date of Patent: Aug. 17, 2021

(54) VOLTAGE DETECTOR OF BATTERY MODULE AND BATTERY PACK

(71) Applicants: Takao Shoji, Shizuoka (JP); Shinichi Yanagihara, Shizuoka (JP)

(72) Inventors: Takao Shoji, Shizuoka (JP); Shinichi Yanagihara, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 169 days.

(21) Appl. No.: 15/701,819

(22) Filed: Sep. 12, 2017

(65) Prior Publication Data

US 2018/0076491 A1 Mar. 15, 2018

(30) Foreign Application Priority Data

Sep. 13, 2016 (JP) .............................. JP2016-178660

(51) Int. Cl.
*H01M 10/00* (2006.01)
*H01M 10/48* (2006.01)
(Continued)

(52) U.S. Cl.
CPC ........ *H01M 10/482* (2013.01); *G01R 31/396* (2019.01); *H01M 10/4257* (2013.01);
(Continued)

(58) Field of Classification Search
CPC .... H01M 10/482; H01M 2/206; H01M 2/202; H01M 10/4257; H01M 2/1077;
(Continued)

(56) References Cited

U.S. PATENT DOCUMENTS

2010/0190050 A1 7/2010 Ochi
2012/0328920 A1 12/2012 Takase et al.
(Continued)

FOREIGN PATENT DOCUMENTS

CN 101769952 A 7/2010
CN 102804452 A 11/2012
(Continued)

OTHER PUBLICATIONS

Japanese Office Action for the related Japanese Patent Application No. 2016-178660 dated Oct. 23, 2018.
Japanese Office Action for the related Japanese Patent Application No. 2016-178660 dated May 28, 2019.
Electric Wire Cable Manual vol. 2, 1st Edition, pp. 753-756 (Machine industry Press), published on Sep. 30, 1980.

*Primary Examiner* — Nicholas P D'Aniello
(74) *Attorney, Agent, or Firm* — Kenealy Vaidya LLP

(57) ABSTRACT

A voltage detector of a battery module includes a flexible conductive member that is disposed for each of two electrode groups formed of electrodes arranged in a row of a battery module that is an aggregate of a battery cell provided with two equipotential portions each of which has a same potential with each of the two electrodes, and is electrically connected to the equipotential portion for each of the electrodes of each of the electrode groups serving as a disposition target. The flexible conductive member includes: a conductive portion for each of the equipotential portions having flexibility that is electrically connected to the equipotential portion and each of an arithmetic processing device of a battery monitoring unit that monitors a voltage of the battery cell; and an insulating portion having flexibility that electrically insulates the plurality of conductive portions from each other.

7 Claims, 8 Drawing Sheets

(51) Int. Cl.
*G01R 31/396* (2019.01)
*H01M 50/20* (2021.01)
*H01M 50/502* (2021.01)
*H01M 10/42* (2006.01)
*G01R 31/3835* (2019.01)

(52) U.S. Cl.
CPC ......... *H01M 50/20* (2021.01); *H01M 50/502* (2021.01); *G01R 31/3835* (2019.01); *H01M 2010/4271* (2013.01)

(58) Field of Classification Search
CPC ......... H01M 2010/4271; H01M 50/20; H01M 50/502; G01R 31/396; G01R 31/3835; Y02E 60/10
See application file for complete search history.

(56) References Cited

U.S. PATENT DOCUMENTS

| | | |
|---|---|---|
| 2015/0380836 A1 | 12/2015 | Ikeda et al. |
| 2018/0090920 A1* | 3/2018 | Shoji ..................... H01M 2/206 |
| 2018/0164382 A1* | 6/2018 | Kataoka ................ G01R 31/396 |

FOREIGN PATENT DOCUMENTS

| | | |
|---|---|---|
| CN | 105103378 A | 11/2015 |
| JP | 2009-231138 A | 10/2009 |
| JP | 2010-176997 A | 8/2010 |
| JP | 2011-210710 A | 10/2011 |
| JP | 2013-054940 A | 3/2013 |
| JP | 2015-69729 A | 4/2015 |

* cited by examiner

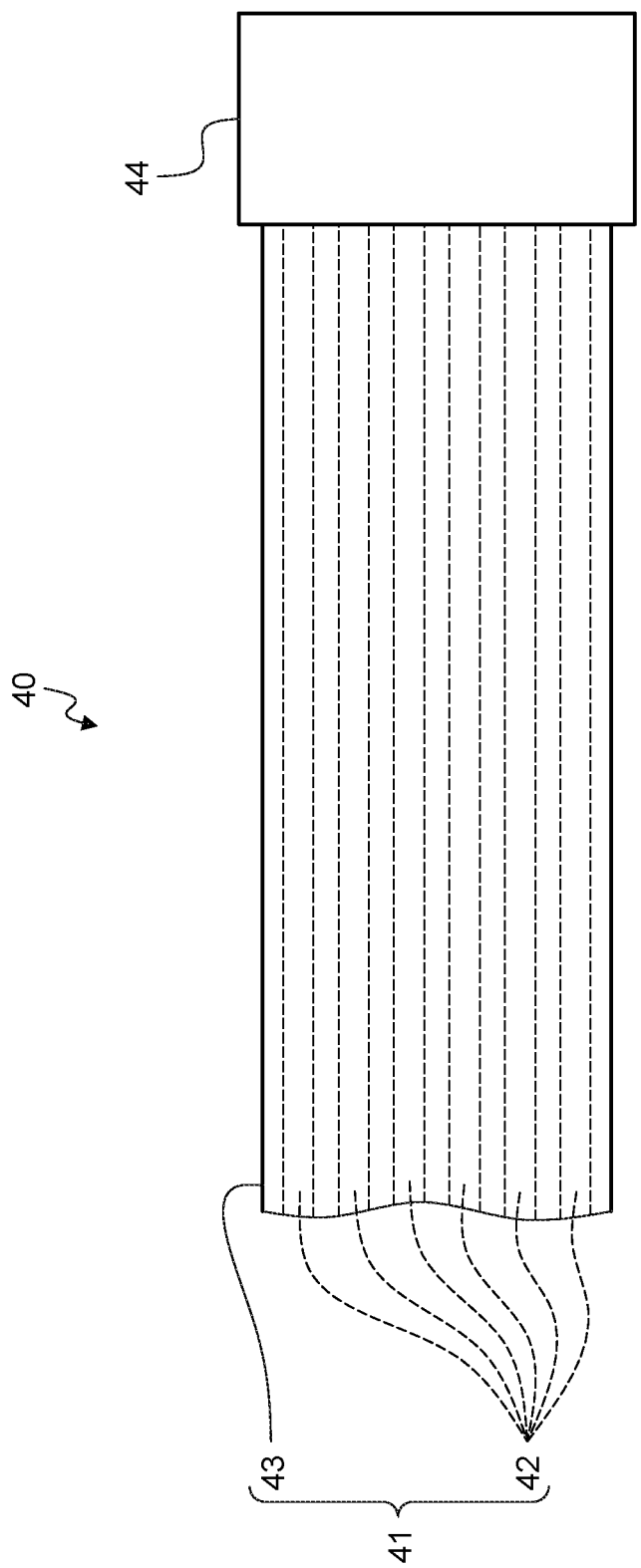

VOLTAGE DETECTOR OF BATTERY MODULE AND BATTERY PACK

CROSS-REFERENCE TO RELATED APPLICATION(S)

The present application claims priority to and incorporates by reference the entire contents of Japanese Patent Application No. 2016-178660 filed in Japan on Sep. 13, 2016.

BACKGROUND OF THE INVENTION

1. Field of the Invention

The present invention relates to a voltage detector of a battery module and a battery pack.

2. Description of the Related Art

Conventionally, a battery module in which a large number of battery cells are arranged in series or in parallel has been mounted in electric vehicles and hybrid cars, from the viewpoint of output, cruising distance, and the like. In the battery module, the respective battery cells are arranged in series in a state where any one of electrode terminals of the respective battery cells are arranged in a row, and the other electrode terminals are also arranged in a row. Further, in this battery module, electrode terminals of adjacent battery cells are physically and electrically connected to each other by electrical connection members (bus bars or the like) for each electrode terminal group arranged in a row in the respective battery cells. The battery module is configured as a battery pack together with such a plurality of electrical connection members. A battery module and a battery pack of this type are disclosed in, for example, Japanese Patent Application Laid-open No. 2015-69729 to be described below.

Meanwhile, management of a voltage in a battery module is important in electric vehicles and hybrid cars, and a battery monitoring unit configured to monitor the voltage is mounted. In recent years, however, there is a demand for achievement of reduction in mounting space of the battery pack, reduction in vehicle weight, or the like by simplifying the configuration of the battery pack in the electric vehicles and the hybrid cars. There is room for improvement in a voltage detector and the battery pack of the conventional battery module in terms of simplification of the configuration of the battery pack.

SUMMARY OF THE INVENTION

Thus, an object of the present invention is to provide a voltage detector of a battery module having a simple configuration, and further, to provide a battery pack having a simple configuration provided with the voltage detector.

In order to achieve the above mentioned object, a voltage detector of a battery module according to one aspect of the present invention includes a flexible conductive member that is disposed for each of two electrode groups each of which includes electrodes arranged in a row of a battery module, the battery module being an aggregate of a battery cell provided with two equipotential portions each of which has a same potential with each of the two electrodes, and that is electrically connected to the equipotential portion for each of the electrodes of each of the electrode groups to be disposed, wherein the flexible conductive member includes: a conductive portion for each of the equipotential portions having flexibility that is electrically connected to the equipotential portion and each of an arithmetic processing device of a battery monitoring unit that monitors a voltage of the battery cell; and an insulating portion having flexibility that electrically insulates the plurality of conductive portions from each other, and a connection portion to physically and electrically connect the conductive portion and the equipotential portion, which serve as connection targets to each other, is provided between the conductive portion and the equipotential portion.

According to another aspect of the present invention, in the voltage detector of the battery module, it is desirable that the connection portion is a fusion coupling portion formed along with welding between the conductive portion and the equipotential portion.

According to still another aspect of the present invention, in the voltage detector of the battery module, it is desirable that the flexible conductive member is a flexible flat conductive member formed to be flat.

In order to achieve the above mentioned object, a battery pack according to still another aspect of the present invention includes a battery module in which two electrode groups formed of electrodes arranged in a row are formed by disposing a plurality of battery cells provided with two equipotential portions each of which has a same potential with each of the two electrodes; an electrical connection member that electrically connects the respective battery cells to each other in series or in parallel by being physically and electrically connected to the two electrodes adjacent to each other in the electrode group; and a flexible conductive member that is disposed for each of the electrode groups and is electrically connected to the equipotential portion for each of the electrodes of each of the electrode groups to be disposed, wherein the flexible conductive member includes: a conductive portion for each of the equipotential portions having flexibility that is electrically connected to the equipotential portion and each of an arithmetic processing device of a battery monitoring unit that monitors a voltage of the battery cell; and an insulating portion having flexibility that electrically insulates the plurality of conductive portions from each other, and a connection portion to physically and electrically connect the conductive portion and the equipotential portion, which serve as connection targets to each other, is provided between the conductive portion and the equipotential portion.

According to still another aspect of the present invention, in the battery pack, it is desirable to further include a separator that is disposed at least between the adjacent battery cells to achieve insulation of the battery cells, wherein the flexible conductive member extends in an arrangement direction of the respective battery cells, and the separator includes a locking portion that has flexibility and elasticity and locks the flexible conductive member in a state where the flexible conductive member is deflected between the connection portions that are adjacently provided.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 8 is a top view illustrating a flexible conductive member.

DETAILED DESCRIPTION OF THE PREFERRED EMBODIMENTS

Hereinafter, embodiments of a voltage detector of a battery module and a battery pack according to the present invention will be described in detail with reference to the drawings. Incidentally, the present invention is not limited by the embodiments.

EMBODIMENT

One of the embodiments of the voltage detector of the battery module and the battery pack according to the present invention will be described with reference to FIGS. 1 to 8.

Figure 1:
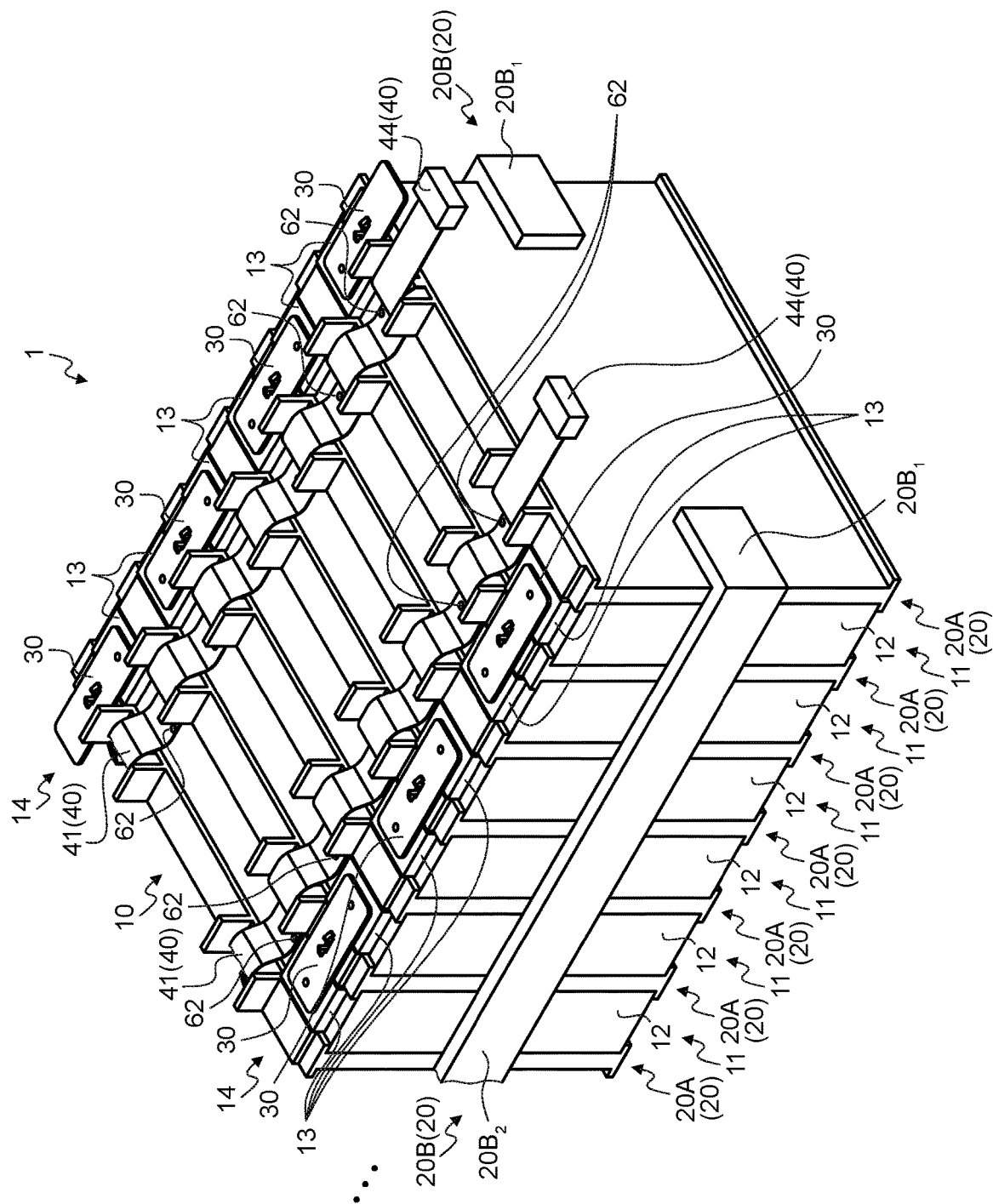
FIG. 1 is a perspective view illustrating a voltage detector of a battery module and a battery pack according to an embodiment.
Figure 2:
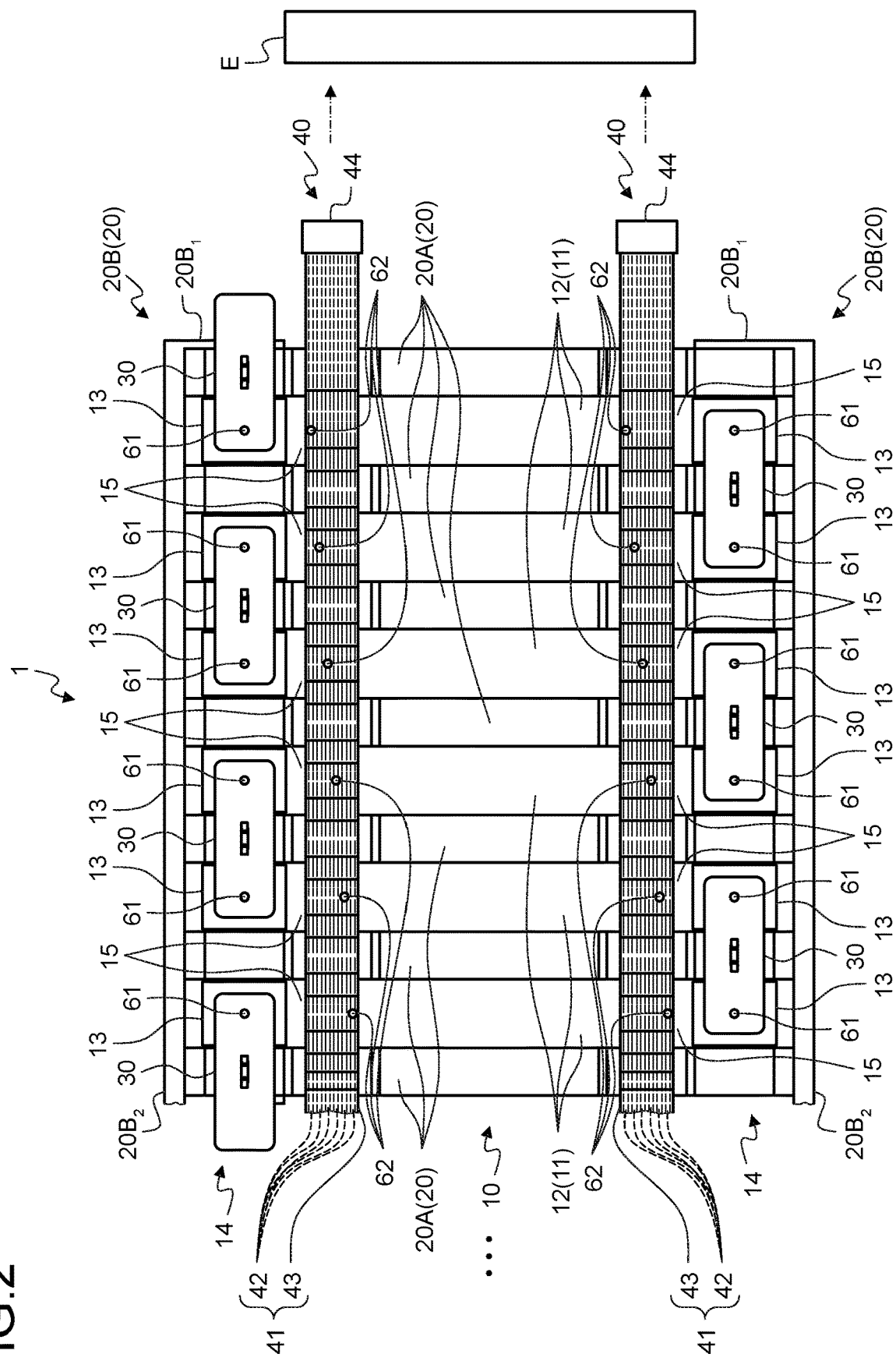
FIG. 2 is a top view illustrating the voltage detector of the battery module and the battery pack according to the embodiment.
Figure 3:
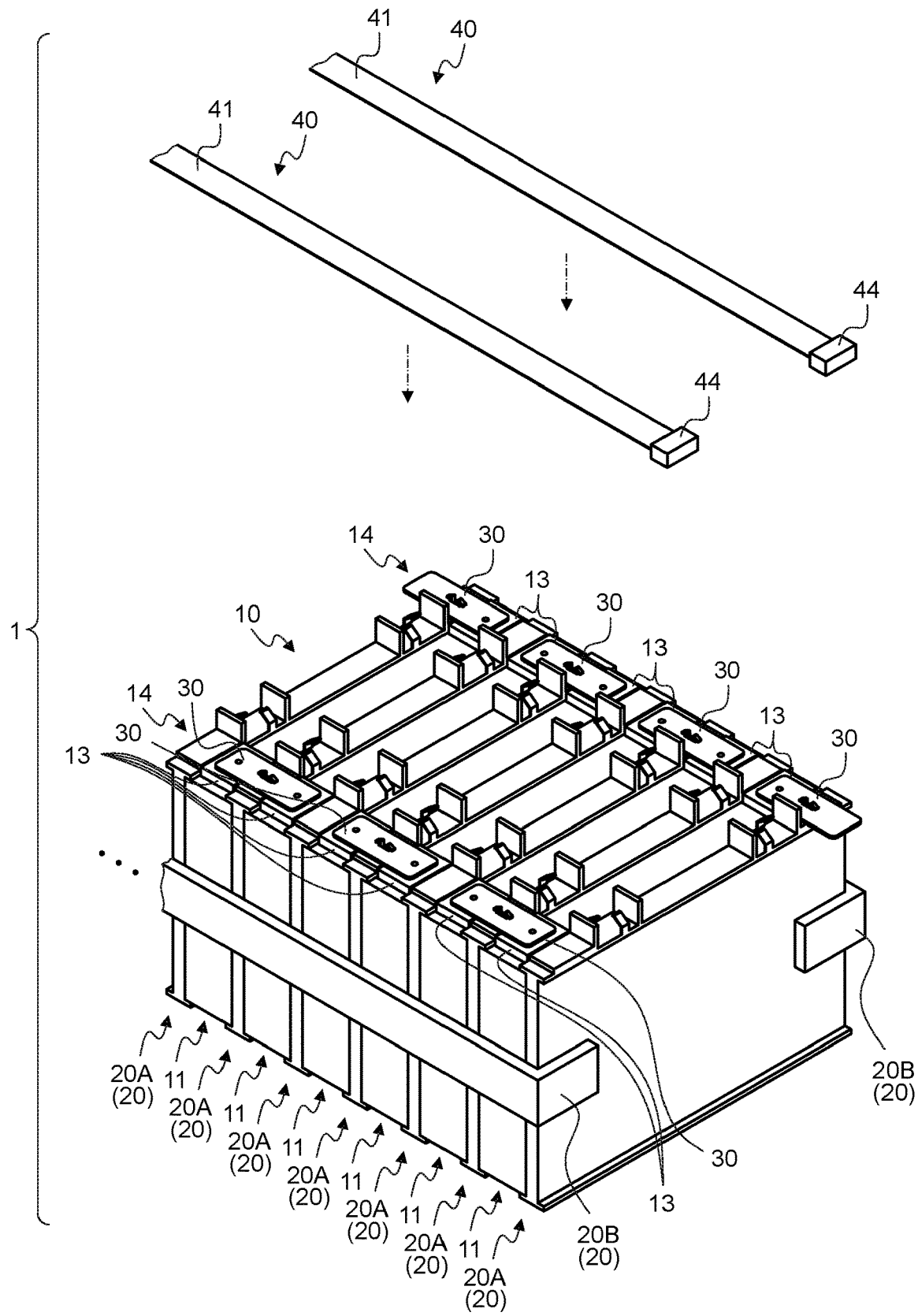
FIG. 3 is an exploded perspective view illustrating a state before assembling the voltage detector.

Reference numeral 1 in FIGS. 1 to 3 represents the battery pack according to the present embodiment. Reference numeral 10 represents a battery module of the battery pack 1. Reference numeral 20 represents a holding structural body of each battery cell 11 in the battery module 10. Reference numeral 30 represents an electrical connection member to electrically connect the respective battery cells 11 to each other in an appropriate manner. Reference numeral 40 represents the voltage detector according to the present embodiment.

The battery pack 1 is mounted on a vehicle such as an electric vehicle or a hybrid car, and includes the battery module 10, the holding structural body 20, the electrical connection member 30, and the voltage detector 40. The battery module 10 is an aggregate of the plurality of battery cells 11. The holding structural body 20 is configured to collectively hold the plurality of battery cells 11 as the battery module 10. The electrical connection member 30 is configured to electrically connect the plurality of battery cells 11 in series or in parallel, and a plurality of the electrical connection members 30 are prepared. The voltage detector 40 is used at the time of detecting a voltage of the battery cell 11.

Figure 4:
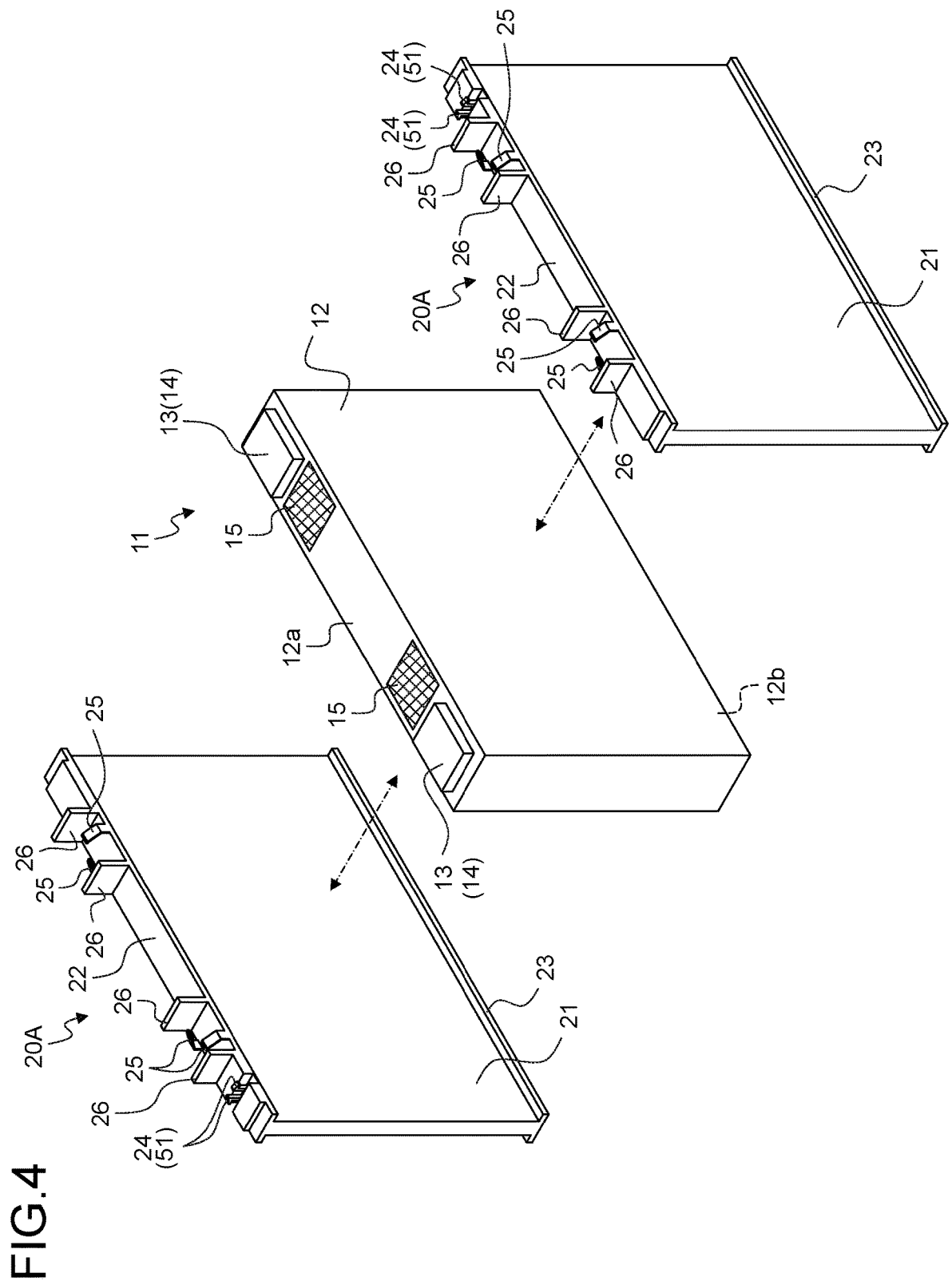
FIG. 4 is an exploded perspective view illustrating a state before assembling a battery cell and a separator.

The battery cell 11 includes two electrodes 13 at one end of a cell body 12 (FIG. 4). For example, the cell body 12 is formed in a rectangular shape in the illustrated battery cell 11, and each of the electrodes 13 is provided on one outer wall surface (hereinafter, referred to as a "first outer wall surface") 12a of the cell body 12. In this example, the first outer wall surface 12a faces an upper side of the vehicle. In this battery cell 11, the electrodes 13 having a rectangular plate shape are provided at both ends of the first outer wall surface 12a in a longitudinal direction. One of the electrodes 13 is a positive electrode and the other thereof is a negative electrode.

In the battery module 10, the respective battery cells 11 are arranged in series in a state where any one of the electrodes 13 of the respective battery cells 11 are arranged in a row and the other electrodes 13 thereof are also arranged in a row. That is, the battery module 10 virtually forms a rectangular shape by arranging the plurality of battery cells 11, and two electrode groups 14 each of which is configured of the electrodes 13 arranged in a row are formed on one surface thereof (FIGS. 1 to 3). There are two types of the battery module 10, one type is obtained by alternately disposing the positive electrode 13 and the negative electrode 13, and the other type is obtained by disposing the same electrode in the two electrode groups 14 arranged in a row. In this battery module 10, the number of arranged battery cells 11 may be any number. For example, the battery module 10 in each drawing is a part that is extracted from the plurality of arranged battery cells 11.

Further, the battery cell 11 is provided with two equipotential portions 15 which individually have the same potential with respect to their own two electrodes 13 (FIG. 4), respectively, in this battery module 10. That is, the respective equipotential portions 15 are provided such that one thereof has the same potential as the positive electrode 13 and the other thereof has the same potential as the negative electrode 13. The same potential referred to herein includes not only the same value as the potential of the electrode 13 but also a value deviated from the potential of the electrode 13 within a range in which an actual voltage value of the battery cell 11 can be detected. Each of the equipotential portions 15 is provided on the first outer wall surface 12a of the cell body 12 on which the electrode 13 is disposed. For example, the equipotential portion 15 may be one in which a conductive portion having the same potential as the electrode 13 is exposed to the outside on the first outer wall surface 12a of the cell body 12, or one in which the conductive portion having the same potential as the electrode 13 is attached to the first outer wall surface 12a of the cell body 12. In addition, the electrode 13 may be provided to entirely or partially extend along the first outer wall surface 12a, and such an extending portion may be used as the equipotential portion 15 in the battery cell 11. In the equipotential portion 15 of this example, the conductive portion having the same potential as the electrode 13 is exposed at the first outer wall surface 12a of the cell body 12. Thus, the equipotential portion 15 is indicated by cross hatching in FIG. 4 for the sake of convenience.

The rectangular shape of the battery module 10 (that is, the state as the aggregate of the battery cells 11) is maintained by the holding structural body 20. The holding structural body 20 includes a separator 20A, which is disposed at least between the adjacent battery cells 11 to achieve insulation of the battery cells 11, and a restraint band 20B as a holding member that holds the plurality of battery cells 11 collectively arranged via the separator 20A from the outside (FIGS. 1 to 3).

The separator 20A is formed using an insulating material such as synthetic resin. The separator 20A is interposed between the adjacent battery cells 11, thereby achieving insulation between the battery cells 11. Thus, the separator 20A illustrated in this example includes a main plate 21 having a rectangular plate shape that covers a main wall surface of the battery cell 11 (a wall surface having a main size such as wall surfaces opposing each other between the adjacent battery cells 11) (FIG. 4). Further, the separator 20A includes a first locking body 22 having a rectangular plate shape that has an orthogonal plane with respect to the main plate 21 and locks the first outer wall surface 12a of the cell body 12, and a second locking body 23 having a rectangular plate shape that has an orthogonal plane with respect to the main plate 21 and locks an outer wall surface (hereinafter, referred to as a "second outer wall surface") 12b on a side opposite to a side of the cell body 12 on which the electrode 13 is arranged (that is, a lower side of the vehicle) (FIG. 4).

The separator 20A is formed by integrally molding the main plate 21, the first locking body 22, and the second locking body 23. In this separator 20A, the first locking body 22 is disposed at an end portion on the upper side of the main plate 21 on the vehicle, and the second locking body 23 is disposed at an end portion on the lower side of the main plate 21 on the vehicle. Here, the first outer wall surface 12a of each of the two adjacent battery cells 11 is locked to the first locking body 22. In addition, the second outer wall surface 12b of each of two adjacent battery cells 11 is locked to the second locking body 23. Thus, the main plate 21, the first locking body 22, and the second locking body 23 are disposed so as to form an I-shaped cross section in the separator 20A.

The plurality of separators 20A are arranged along an arrangement direction of the respective battery cells 11 such that all of the battery cells 11 are sandwiched between the two separators 20A in the holding structural body 20 illustrated in this example.

The restraint band 20B is configured to hold the plurality of battery cells 11 and the plurality of separators 20A in the state of being alternately arranged and stacked in the arrangement direction of the respective battery cells 11. The restraint band 20B illustrated in this example is molded in a U-shape including two first locking portions $20B_1$, which respectively lock both ends (here, the respective planes of the main plates 21 of the two separators 20A at both ends) in the arrangement direction of the respective battery cells 11, and a second locking portion $20B_2$ which connects the two first locking portions $20B_1$ along the arrangement direction thereof and locks lateral sides of the plurality of battery cells 11 and the main plates 21 of the plurality of separators 20A (FIGS. 1 to 3). The two restraint bands 20B are provided so as to lock the respective lateral sides of each of the plurality of battery cells 11 and the plurality of separators 20A. The restraint band 20B is molded using an insulating material. For example, the restraint band 20B may be molded using a synthetic resin material or may be molded using an elastic material such as rubber. Incidentally, only one between the two first locking portions $20B_1$ is illustrated in the drawing.

Figure 5:
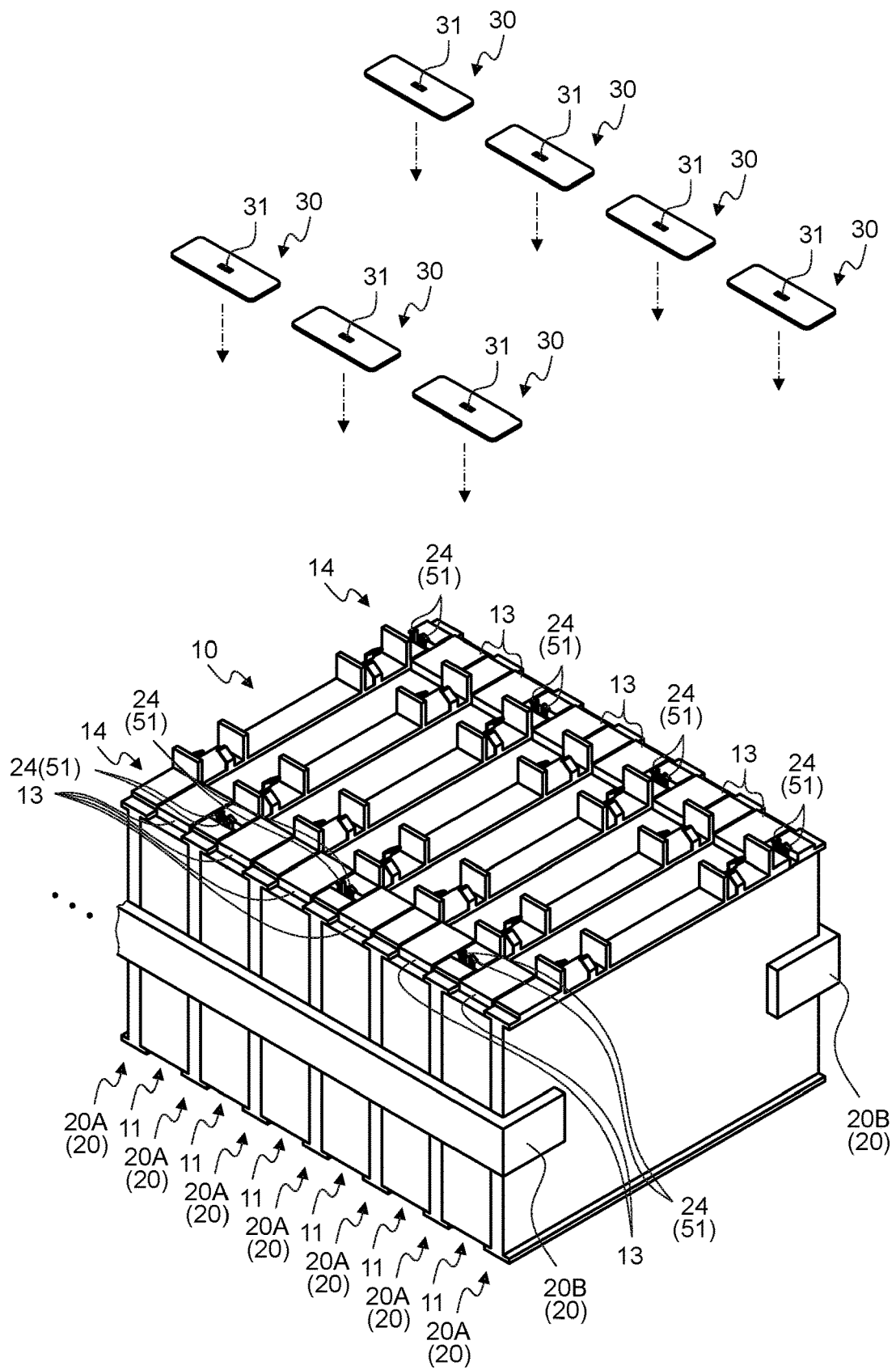
FIG. 5 is an exploded perspective view illustrating a state before assembling an electrical connection member.

FIG. 5 illustrates the battery module 10 in which the respective battery cells 11 are held by this holding structural body 20. The electrical connection member 30 is attached to the battery module 10 in this state. The electrical connection member 30 is formed using a conductive material such as metal and is physically and electrically connected to each of the two adjacent electrodes 13 in the electrode group 14, thereby causing the two electrodes 13 to be electrically connected to each other and causing the respective battery cells 11 to be electrically connected to each other in series or in parallel. In addition, the electrical connection member 30 is sometimes connected to the total positive electrode or the total negative electrode of the battery module 10, and in this case, the electrical connection member 30 is physically and electrically connected to the electrode 13 as the total positive electrode or the electrode 13 as the total negative electrode. The plurality of electrical connection members 30 are arranged to have intervals from each other along the arrangement direction of the respective electrodes 13 in the electrode group 14. Incidentally, the battery cell 11 disposed at one end in the arrangement direction of the respective battery cells 11 has the electrode 13 serving as the total positive electrode, and the battery cell 11 disposed at the other end in the arrangement direction has the electrode 13 serving as the total negative electrode in the battery module 10.

Figure 6:
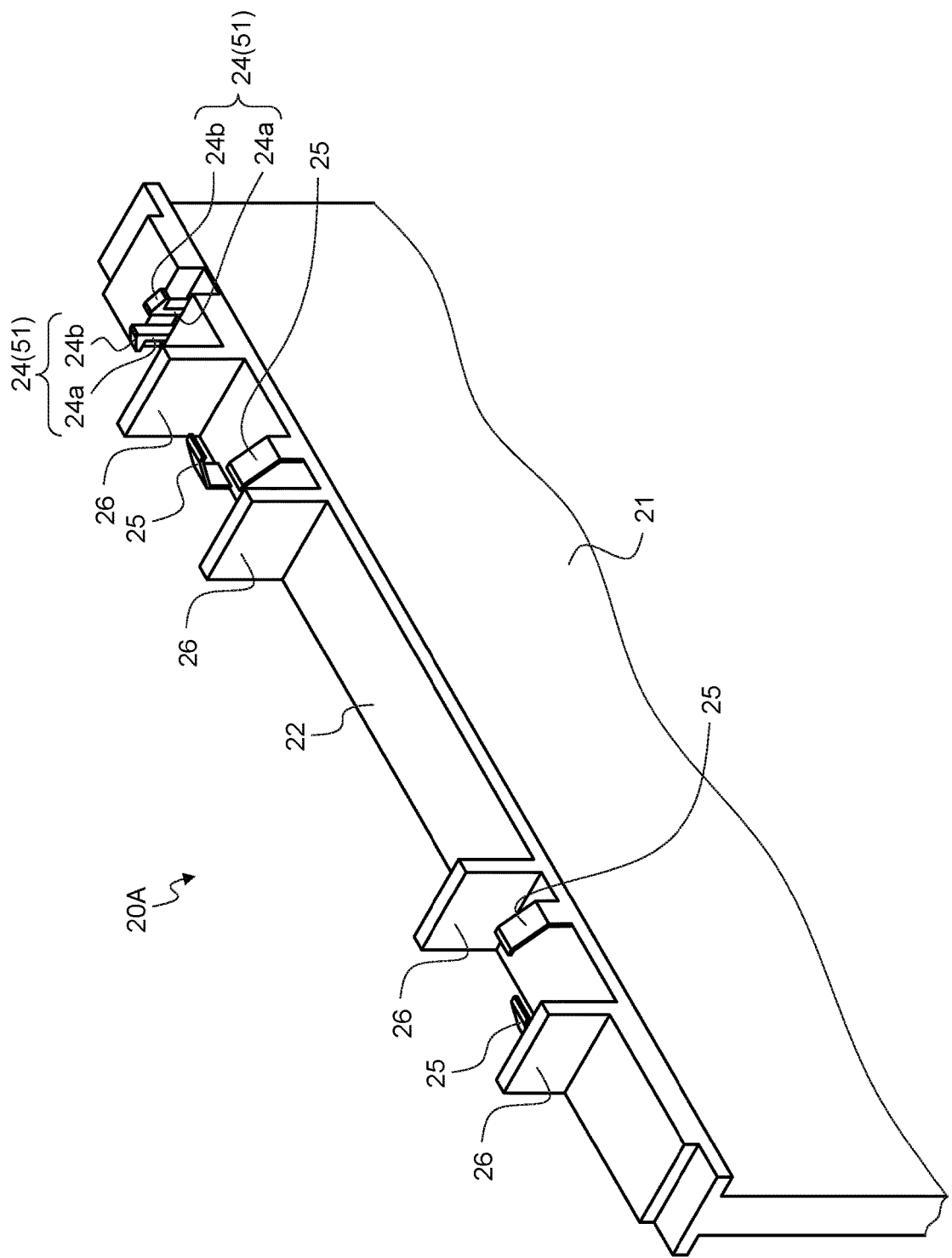
FIG. 6 is a perspective view obtained by enlarging a part of the separator.

A so-called bus bar molded in a rectangular plate shape is used as the electrical connection member 30 illustrated in this example. The electrical connection member 30 is extended so as to be placed on each of the two adjacent electrodes 13 in the electrode group 14. That is, the electrical connection member 30 is disposed so as to straddle the separator 20A between the two battery cells 11 having the two electrodes 13. In addition, the same electrical connection member 30 illustrated in this example that can be connected to the two electrodes 13 is also used for the total positive electrode side and the total negative electrode side. Thus, the respective electrical connection members 30 on the total positive electrode side and the total negative electrode side are disposed on an outer side of the battery module 10 straddling the separators 20A at both ends, respectively, in the arrangement direction. Thus, the electrical connection member 30 is held by the separator 20A that the own electrical connection member straddles. A holding structure 51 to hold the electrical connection member 30 on the separator 20A is provided between the separator 20A and the electrical connection member 30 (FIGS. 4 to 6).

Figure 7:
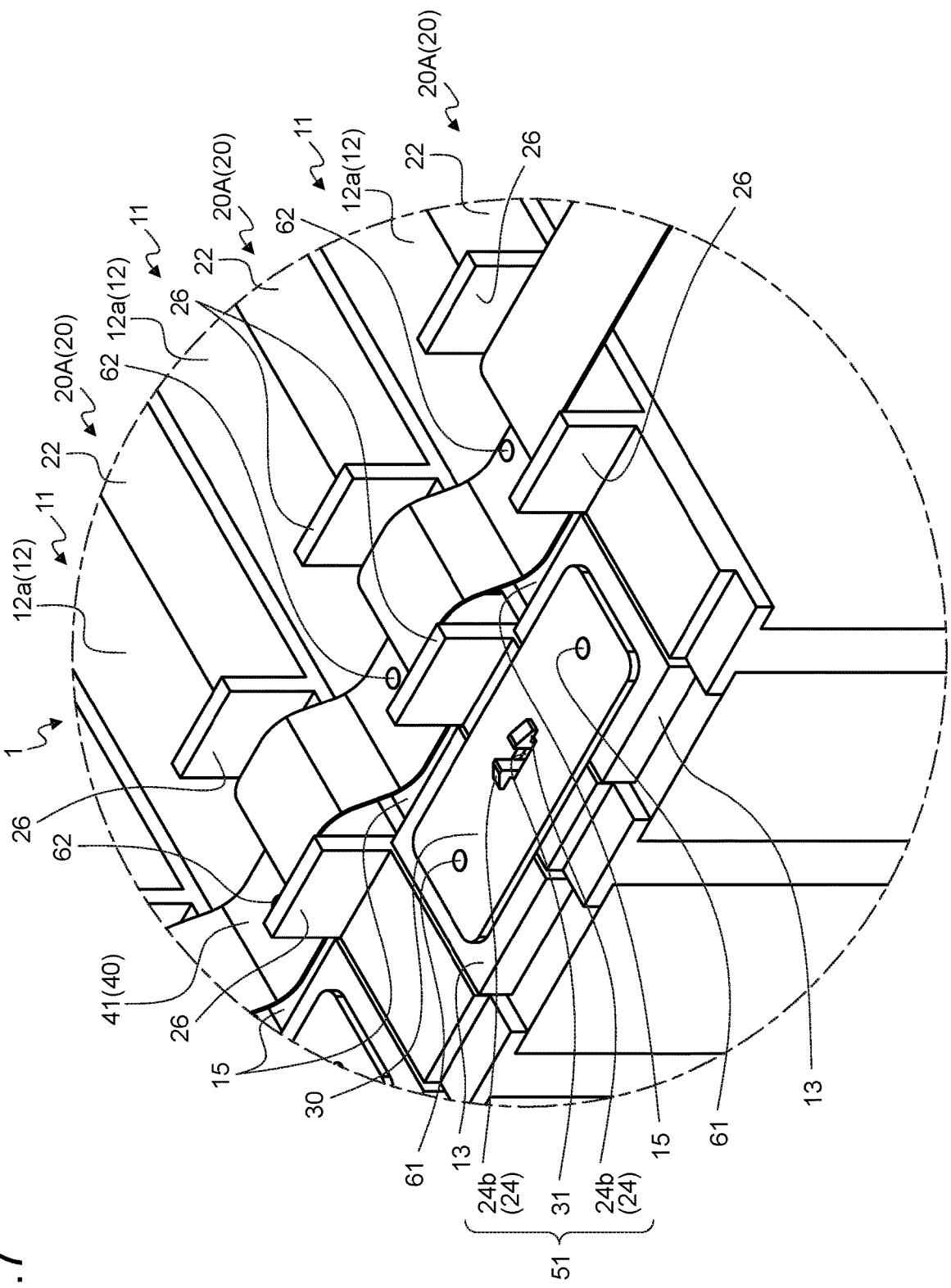
FIG. 7 is a perspective view obtained by enlarging a part of the battery pack.

The holding structure 51 includes an engaging portion 24 (FIGS. 4 to 6) provided in the separator 20A and an engaged portion 31 (FIG. 5) provided in the electrical connection member 30 and engaged with the engaging portion 24. In the holding structure 51, the engaging portion 24 and the engaged portion 31 are engaged with each other so that the electrical connection member 30 is held by the separator 20A. The engaging portion 24 forms a holding portion configured to hold the electrical connection member 30. On the other hand, the engaged portion 31 forms a held portion configured to be held by the engaging portion 24 of the separator 20A. Here, the electrical connection member 30 straddles the first locking body 22 of the separator 20A to be placed on the two adjacent electrodes 13, and surfaces of the electrodes 13 oppose each other at such a straddling portion. Therefore, the engaging portion 24 is provided on an opposing surface of the first locking body 22 that opposes the electrical connection member 30. Thus, this engaging portion 24 is provided at one place in the separator 20A. The engaging portion 24 has a flexible portion 24a having flexibility and protruding from the opposing surface of the first locking body 22 toward an opposing surface of the electrical connection member 30 and a claw portion 24b protruding from a free end (end portion on a protruding side) of the flexible portion 24a toward the arrangement direction of the respective battery cells 11 (FIG. 6). In this illustrated example, the two engaging portions 24 are disposed to have intervals from each other in the arrangement direction. The respective engaging portions 24 are disposed such that protruding directions of the respective claw portions 24b are set to be opposite to each other and the respective claw portions 24b do not oppose each other. The engaged portion 31 is formed as a through hole through which each of the engaging portions 24 is inserted from the claw portion 24b side when the electrical connection member 30 is placed on the two adjacent electrodes 13. Accordingly, the engaging portion 24 disposes the claw portion 24b so as to be caught by the surface of the electrical connection member 30 when being taken out from the engaged portion 31 (FIG. 7).

The electrical connection member 30 is physically connected to each of the two adjacent electrodes 13 in the state of being held by the separator 20A through the holding structure 51. Thus, a connection portion 61 to physically and electrically connect the electrode 13 and the electrical connection member 30 is provided between the electrode 13 and the electrical connection member 30 (FIG. 2). In this illustrated example, the electrode 13 and the electrical connection member 30 are connected by welding (for example, laser welding). Accordingly, the connection portion 61 is provided as a fusion coupling portion that is formed along with welding between the electrode 13 and the electrical connection member 30.

The voltage detector 40 is disposed for each of the electrode groups 14. The voltage detector 40 includes a flexible conductive member 41 having flexibility (FIGS. 1 to 3). The flexible conductive member 41 is electrically connected to the equipotential portion 15 of each of the electrodes 13 in the electrode group 14 serving as a disposition target. The flexible conductive member 41 includes a conductive portion 42, which has flexibility, for each of the equipotential portions 15 and an insulating portion 43 having flexibility (FIGS. 2 and 8).

The conductive portion 42 is electrically connected to each of an arithmetic processing device E (FIG. 2) of a battery monitoring unit that monitors the state (here, the voltage) of the battery cell 11 and the equipotential portion 15 serving as a connection target. The insulating portion 43 electrically insulates the plurality of conductive portions 42 from each other. The flexible conductive member 41 is formed by integrating the plurality of conductive portions 42 and the insulating portion 43, and is assembled to the battery module 10 in the state of being extended in the arrangement direction of the respective battery cells 11. When electric signals of the two conductive portions 42 relating to the common battery cell 11 are input from both of the flexible conductive members 41, the arithmetic processing device E obtains a potential difference based on the respective electric signals and calculates a voltage of this battery cell 11.

The voltage detector 40 includes a connector 44 to be assembled to the flexible conductive member 41 (FIGS. 1 to 3 and 8). In this illustrated example, the connector 44 is provided for each of the flexible conductive members 41. The connector 44 electrically connects each of the plurality of conductive portions 42 in the flexible conductive member 41 to the arithmetic processing device E, and is fitted to a connector (not illustrated) on the arithmetic processing device E side. On the other hand, a connection portion 62, which physically and electrically connects the conductive portion 42 and the equipotential portion 15 to each other, is provided between the conductive portion 42 and the equipotential portion 15 serving as connection targets to each other (FIGS. 1 and 2).

Hereinafter, a specific example of the flexible conductive member 41 will be described.

The flexible conductive member 41 according to the present embodiment is configured as a flexible flat conductive member formed to be flat. For example, it is possible to use a flat cable (so-called FC), a flexible flat cable (so-called FFC), a printed circuit body such as a flexible printed circuit board (so-called FPC) and a membrane wiring board, or the like as the flexible conductive member 41. In this specific example, the flexible flat cable is taken as an example of the flexible conductive member 41.

The flexible conductive member 41 in this illustrated example includes the plurality of conductive portions 42 which extend along the arrangement direction of the respective battery cells 11 and are arranged to have intervals from each other along the first outer wall surfaces 12a of the respective cell bodies 12. The conductive portion 42 illustrated in this example is a conductor that is molded in a foil shape using a conductive material such as a metal (for example, copper), and has flexibility to a degree that can be processed to be folded. The insulating portion 43 covers the plurality of conductive portions 42 with such arrangement so as to enclose the conductive portions 42, and is formed using a material such as synthetic resin having an electrical insulation property and flexibility. The insulating portion 43 illustrated in this example is formed such that an external shape thereof is similar to a flat plate.

The flexible conductive member 41 illustrated in this example is provided with the plurality of connection portions 62 for each of the conductive portions 42. In this illustrated example, the conductive portion 42 and the equipotential portion 15 are connected by welding (for example, laser welding). Accordingly, the connection portion 62 is provided as a fusion coupling portion that is formed along with welding between the conductive portion 42 and the equipotential portion 15. Incidentally, the conductive portion 42 and the equipotential portion 15 may be directly connected to each other using another connection form such as soldering, and further, may be indirectly connected to each other with a conductive connection member interposed therebetween.

In addition, the flexible conductive member 41 in this illustrated example is assembled to the battery module 10 in the state of being deflected between the connection portions 62 which are adjacently provided. Such deflection is configured to absorb a tolerance variation in a mutual positional relationship between the adjacent battery cells 11 (deviation of the interval in the arrangement direction of the respective battery cells 11, positional deviation of the first outer wall surfaces 12a of the respective cell bodies 12, or the like) when the flexible conductive member 41 is assembled to the battery module 10, and is configured to absorb expansion and contraction of the cell body 12 at the time of charge and discharge after being assembled to the battery module 10. Thus, a magnitude of this deflection is determined in consideration of the tolerance variation and the expansion and contraction of the cell body 12. Accordingly, the voltage detector 40 of the battery module 10 and the battery pack 1 according to the present embodiment can improve workability of assembling the flexible conductive member 41 to the battery module 10, and further, reduce a load on the flexible conductive member 41 after the assembling. Therefore, the voltage detector 40 of the battery module 10 and the battery pack 1 can improve the durability of the flexible conductive member 41, and further, it is possible to hold an electrical connection state between the conductive portion 42 and the equipotential portion 15 since a load on the connection portion 62 is also reduced and it is possible to maintain connection strength of the connection portion 62.

Here, the separator 20A is provided with a locking portion 25 configured to maintain the deflection of the flexible conductive member 41 assembled to the battery module 10 (FIGS. 4 and 6). The flexible conductive member 41 is locked to the locking portion 25 in the state of being deflected between the adjacently provided connection portions 62. For example, the flexible conductive member 41 straddles the first locking body 22 of the separator 20A between the adjacently provided connection portions 62, and a curved surface of a deflected portion opposes a surface of the first locking body 22 at such a straddling portion. Thus, the locking portion 25 is provided on an opposing surface of the first locking body 22 that opposes the flexible conductive member 41. The locking portion 25 protrudes from the opposing surface of the first locking body 22 toward the curved surface of the deflected portion of the flexible conductive member 41. Accordingly, the locking portion 25 can maintain the deflection of the flexible conductive member 41 assembled to the battery module 10. In addition, the locking portion 25 is formed so as to have flexibility and elasticity such that input from the deflected portion of the flexible conductive member 41 is absorbed. Therefore, the voltage detector 40 of the battery module 10 and the battery pack 1 according to the present embodiment can improve the durability of the flexible conductive member 41 and the locking portion 25 since the input of an excessive load between the flexible conductive member 41 and the locking portion 25 is reduced when the expansion and contraction of the cell body 12 or the like occurs.

For example, the locking portion 25 illustrated in this example is a plate-shaped member that is folded in an L-shape, and the two locking portions 25 are provided for one deflected portion of the flexible conductive member 41. In addition, the two flexible conductive members 41 straddle different places, respectively, in the first locking body 22 illustrated in this example. Thus, such a combination of the two locking portions 25 is provided for each of the flexible conductive member 41.

Further, the first locking body 22 of the separator 20A is provided with two wall portions 26 such that the combination of the two locking portions 25 is interposed therebetween (FIGS. 4 and 6). The respective wall portions 26 are provided such that the deflected portion of the flexible conductive member 41, which straddles the two locking portions 25, is interposed therebetween and are disposed to have intervals from each other in a width direction of the flexible conductive member 41 (a direction along an arrangement direction of the respective conductive portions 42). In addition, each of the wall portions 26 is disposed at an interval wider than a width of the flexible conductive member 41 and at an interval that prevents the deflected portion from leaving a locking position set by the two locking portions 25.

Meanwhile, it is possible to use the same separator 20A according to the present embodiment entirely in the single battery pack 1. When the battery pack 1 is configured using the separators 20A of the single type, the separators 20A to be adjacently provided among the arranged separators 20A are disposed in directions opposite to each other. One of the separators 20A is provided with the engaging portion 24 on a side where one of the flexible conductive members 41 straddles but is not provided with the engaging portion 24 on a side where the other flexible conductive member 41 straddles. On the contrary, the other separator 20A is not provided with the engaging portion 24 on the side where one of the flexible conductive members 41 straddles, but is provided with the engaging portion 24 on the side where the other flexible conductive member 41 straddles.

As described above, the voltage detector 40 of the battery module 10 and the battery pack 1 according to the present embodiment physically and directly connect the conductive portion 42 of the flexible conductive member 41 to the equipotential portion 15 of the battery cell 11 using a means such as welding, and electrically connect the equipotential portion 15 and the conductive portion 42, thereby enabling the arithmetic processing device E to grasp a potential of the electrode 13 having the same potential as the equipotential portion 15. Further, the voltage detector 40 of the battery module 10 and the battery pack 1 are provided with the flexible conductive member 41 for each of the electrode groups 14 of the battery module 10, and thus, it is possible to cause the arithmetic processing device E to grasp the potential of each of the electrodes 13 for each of the battery cells 11 and to detect the voltage for each of the battery cells 11. In this manner, the voltage detector 40 of the battery module 10 and the battery pack 1 according to the present embodiment can send the electric signal, required at the time of detecting the voltage of the battery cell 11, from the battery cell 11 to the arithmetic processing device E without using other parts (for example, the electrical connection member 30 and the like). That is, the voltage detector 40 of the battery module 10 and the battery pack 1 can obtain the electric signal required for detection of the voltage of the battery cell 11 with the simple configurations.

For example, in the case of obtaining the electric signal of the battery cell 11 via another part such as the electrical connection member 30, it is necessary to assemble the other part and the flexible conductive member 41 to the battery module 10, and then, to physically and electrically connect the other part and the flexible conductive member 41 to each other in a direct manner or to electrically connect the other part and the flexible conductive member 41 in an indirect manner via a still another part having conductivity, and thus, there is a risk that the number of steps of the assembling work increases. Further, it is necessary to integrate the other parts such as the electrical connection member 30 and the flexible conductive member 41 and assemble this integrated body to the battery module 10, for example, in order to suppress such deterioration of the assembling workability. However, there is a possibility that a size of such an integrated body increases, and there is a risk of causing an increase in size of the battery pack 1. In addition, there is a possibility that a holding structure for the battery module 10 is additionally is required in this integrated body, and there is a risk of causing the size increase and an increase in cost accompanying such a requirement. On the other hand, the voltage detector 40 of the battery module 10 and the battery pack 1 according to the present embodiment have the simple configurations capable of obtaining the electric signal required for detection of the voltage of the battery cell 11 without using the other parts, and thus, are superior in assembling workability and can suppress the increase in cost. In addition, it is possible to suppress the increase of the size in the battery pack 1.

A voltage detector of a battery module and a battery pack according to the present embodiment physically and directly connect a conductive portion of a flexible conductive member to an equipotential portion of a battery cell, and electrically connect the equipotential portion and the conductive portion, thereby enabling an arithmetic processing device to grasp a potential of an electrode having the same potential as the equipotential portion. Further, the voltage detector of the battery module and the battery pack are provided with such a flexible conductive member for each electrode group of the battery module, and thus, it is possible to cause the arithmetic processing device to grasp a potential of each electrode for each battery cell and to detect the voltage for each battery cell. In this manner, the voltage detector of the battery module and the battery pack can send an electric signal, required at the time of detecting a voltage of the battery cell, from the battery cell to the arithmetic processing device without using other parts (for example, an electrical connection member and the like). That is, the voltage detector of the battery module and the battery pack can obtain the electric signal required for detection of the voltage of the battery cell with simple configurations. Accordingly, the voltage detector of the battery module and the battery pack are superior in assembling workability and can suppress an increase in cost.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A voltage detector of a battery module, comprising:
a pair of flexible conductive members that are each disposed for a respective one of two electrode groups each of which includes electrodes arranged in a row of a battery module, the battery module being an aggregate of a battery cell provided with two equipotential portions each of which has a same potential with each of the two electrodes, and that is electrically connected to the equipotential portion for each of the electrodes of each of the electrode groups to be disposed, wherein
the battery module electrically connects the respective battery cells to each other in series or in parallel by being physically and electrically connected to two electrodes adjacent to each other in a respective one of the electrode groups by an electrical connection member, and
the equipotential portions are provided independently of the electrodes, and are a different member from the electrical connection member,
each of the flexible conductive members includes:
a plurality of conductive portions having flexibility, each of the conductive portions is electrically connected to a respective one of the equipotential portions and is electrically connected to an arithmetic processing device of a battery monitoring unit that monitors a voltage of the battery cell; and
an insulating portion having flexibility that electrically insulates the plurality of conductive portions from each other,
a connection portion to physically and electrically connect a respective one of the conductive portions and the respective one of the equipotential portions, which serve as connection targets to each other, is provided between the respective one of the conductive portions and the respective one of the equipotential portions,
each of the equipotential portions includes a second conductive portion having the same potential as the electrode, and the second conductive portion is either exposed to an outside on an outer wall surface of a cell body of the battery cell, or attached to the outer wall surface of the cell body, and
each of the equipotential portions is spaced away from each of the electrodes.

2. The voltage detector of the battery module according to claim 1, wherein
the connection portion is a fusion coupling portion formed along with welding between the conductive portion and the equipotential portion.

3. The voltage detector of the battery module according to claim 1, wherein
the flexible conductive member is a flexible flat conductive member formed to be flat.

4. The voltage detector of the battery module according to claim 2, wherein
the flexible conductive member is a flexible flat conductive member formed to be flat.

5. A battery pack comprising:
a battery module including a plurality of battery cells, each of the battery cells includes two electrodes and two equipotential portions each of which has a same potential with each of the two electrodes, and the battery cells are disposed such that the electrodes form two electrode groups arranged in a respective row;
an electrical connection member that electrically connects the respective battery cells to each other in series or in parallel by being physically and electrically connected to two electrodes adjacent to each other in a respective one of the electrode groups; and
a pair of flexible conductive members that are each disposed for for the respective one of the electrode groups and is physically and electrically connected to the equipotential portion for each of the electrodes of a respective one of the electrode groups, wherein
the equipotential portions are provided on an outer wall surface of a cell body, independently of the electrodes, and are a different member from the electrical connection member,
each of the flexible conductive members includes:
a conductive portion for each of the equipotential portions having flexibility that is electrically connected to a respective one of the equipotential portions and each of an arithmetic processing device of a battery monitoring unit that monitors a voltage of the battery cell; and
an insulating portion having flexibility that electrically insulates the plurality of conductive portions from each other,
a connection portion to physically and electrically connect a respective one of the conductive portions and the respective one of the equipotential portions, which serve as connection targets to each other, is provided between the respective one of the conductive portions and the respective one of the equipotential portions,
each of the equipotential portions includes a second conductive portion having the same potential as the electrode, and the second conductive portion is either exposed to an outside on an outer wall surface of a cell body of the battery cell, or attached to the outer wall surface of the cell body, and
each of the equipotential portions is spaced away from each of the electrodes.

6. The battery pack according to claim 5, further comprising:
a separator that is disposed at least between the adjacent battery cells to achieve insulation of the battery cells, wherein
the flexible conductive member extends in an arrangement direction of the respective battery cells, and
the separator includes a locking portion that has flexibility and elasticity and locks the flexible conductive member in a state where the flexible conductive member is deflected between the connection portions that are adjacently provided.

7. The battery pack according to claim 6, wherein
the electrical connection member includes an engaged portion that is spaced away from the two electrodes adjacent to each other, and
the separator includes an engaging portion that protrudes through the engaged portion such that the electrical connection member is held by the separator.

* * * * *